(12) United States Patent
Bitzer

(10) Patent No.: US 8,102,137 B2
(45) Date of Patent: Jan. 24, 2012

(54) METHOD OF DETECTING A USEFUL SIGNAL

(75) Inventor: Franz Bitzer, Friedrichshafen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 441 days.

(21) Appl. No.: 12/418,061

(22) Filed: Apr. 3, 2009

(65) Prior Publication Data

US 2009/0261763 A1    Oct. 22, 2009

(30) Foreign Application Priority Data

Apr. 16, 2008    (DE) .................... 10 2008 001 202

(51) Int. Cl.
*G05B 11/01* (2006.01)

(52) U.S. Cl. ....................... 318/629; 318/632

(58) Field of Classification Search ............. 318/629, 318/632, 635
See application file for complete search history.

(56) References Cited

U.S. PATENT DOCUMENTS

| | | | |
|---|---|---|---|
| 5,309,378 A | 5/1994 | Beierle | |
| 5,410,604 A | 4/1995 | Saito et al. | |
| 6,102,144 A * | 8/2000 | Lutz ........................... | 180/65.25 |
| 6,128,959 A * | 10/2000 | McGovern et al. ............. | 73/660 |
| 6,729,186 B1 * | 5/2004 | Sirrine et al. .................... | 73/660 |
| 7,174,246 B2 * | 2/2007 | Bitzer .............................. | 701/51 |
| 7,203,579 B2 * | 4/2007 | Yokota et al. .................... | 701/29 |
| 7,334,552 B2 * | 2/2008 | Moller et al. .............. | 123/192.1 |
| 7,516,031 B2 | 4/2009 | Kogan | |
| 7,783,434 B2 | 8/2010 | Keese et al. | |
| 2008/0119995 A1 | 5/2008 | Ubel et al. | |

FOREIGN PATENT DOCUMENTS

| | | |
|---|---|---|
| DE | 20 2004 009 922 U1 | 8/2005 |
| DE | 20 2004 009 922 U1 | 12/2005 |
| DE | 10 2006 001 468 A1 | 8/2006 |
| DE | 10 2005 018 084 A1 | 10/2006 |
| DE | 10 2006 019 551 A1 | 8/2007 |
| DE | 60 2005 004 506 T2 | 1/2009 |

* cited by examiner

*Primary Examiner* — Rina Duda
(74) *Attorney, Agent, or Firm* — Davis & Bujold, P.L.L.C.

(57) ABSTRACT

A method of detecting a useful signal from a measurement signal that is overlaid by at least one interference signal for use in a control or regulating device, where the interference signal occurs with at least one known interference signal frequency. The method including the steps of detecting the measurement signal, performing a Fourier transformation on the measurement signal with reference to the interference signal frequency to detect the interference signal amplitude and phase, detecting the interference signal on the basis of the interference signal amplitude and phase, and removing the interference signal from the measurement signal to detect the useful signal. The Fourier transformation is performed only with reference to the known interference signal frequency to simplify the computation making it possible to detect the useful signal in real time.

6 Claims, 2 Drawing Sheets

METHOD OF DETECTING A USEFUL SIGNAL

This application claims priority from German patent application serial no. 10 2008 001 202.5 filed Apr. 16, 2008.

FIELD OF THE INVENTION

The invention relates to a method for detecting a useful signal from a measurement signal that is overlaid by at least one interference signal in, for example, a control or regulating device of a motor vehicle or the like, when the interference signal occurs with at least one known interference signal frequency.

BACKGROUND OF THE INVENTION

A measurement signal for detecting the parameters of technical devices is the preferred means in many areas of technology for analyzing parameters and controlling or regulating these parameters on the basis of this analysis. The measurement signals usually exist in electronic form, such as electric voltages, for example.

Motor vehicle technology is one area of technology in which measurement signals play an important role is. They are used there to detect the parameters of various components of the vehicle, such as the parameters of the drive motor, for example, or the clutch, or the transmission, and to analyze them, so that these parameters or components of the motor vehicle can be controlled or regulated. Here, the parameters can be periodic or non-periodic in nature. One example of non-periodic parameters in motor vehicle technology is the speed of the vehicle, while the rotational angle position of the input shaft of the motor vehicle transmission is one of the periodic parameters.

It is often the case that the measurement signal detects not only the parameter that is to be analyzed, but also other parameters that are associated with this parameter. In such cases, the measurement signal does not correspond to the pure useful signal that is necessary for the analysis of the parameter, but is rather combined with an interference signal. The interference signals in the measurement signals quite often reach a magnitude that complicates or distorts analysis of the parameter to such an extent that the control or regulation of the parameter based on the analysis is no longer adequately possible.

In one case, which occurs very often in vehicular technology, the cause of an interference signal occurs periodically, and the cycle of this cause is known. The interference signal is then periodic as well, and the cycle of the interference signal is usually described in terms of an interference signal frequency. If the cause of the interference signal is known, the interference signal cycle is usually known as well. One example of this is the natural drive train oscillation that occurs in drive trains with a known cycle. The oscillation causes an interference signal which overlays, with a known interference signal frequency, the measurement signal of the initial speed of the transmission of a motor vehicle.

This results in the necessity of developing methods and the appurtenant devices by means of which the interference signals can be removed from a measurement signal, in order to detect the useful signal.

Various methods and appurtenant devices for this purpose are known from the state of the art.

One type of widely used method uses filter algorithms that are based on high-pass filters, low-pass filters, band-pass filters, or band rejection filters. However, these filter algorithms display numerous disadvantages. Thus, depending on the filter frequency or the cut-off frequency used at any given time, a phase delay can occur, which can have an adverse effect on a parameter. In addition, the filter parameters must be chosen in such a way that they are optimally adjusted to a certain filter frequency. If the filter frequency changes, the filter parameters must also be changed, in order to main the optimum adjustment. This is often adjusted for by using of a plurality of filters with different filter frequencies, but this is very complicated in terms of construction. If characteristic curves with steep gradients are required for the filters, the filter order also increases, and therefore the number of filter parameters, which also increases software and/or construction complexity.

Another type of method that is also often used is based on integral transformations. The German utility model DE 20 2004 009 922 U1 illustrates a few relevant integral transformations from the class of wavelet transformation. Wavelet transformations are very complicated in computational terms and cannot normally be used to control or regulate parameters in real time due to the limited computing power of the control or regulating devices of motor vehicles.

Another type of practically applicable method is based on a different type of integral transformation, the Fourier transformation, which is also mentioned in the German utility model DE 20 2004 009 922 U1. The disadvantage of Fourier transformations is that they are usually done with reference to a plurality of frequencies. Here too, the computational complexity is often so great that no analysis of the measurement signal in real time, and therefore also no control or regulation of the parameters on which the measurement signal is based, can be done by the control or regulating device of motor vehicles.

SUMMARY OF THE INVENTION

The invention is therefore based on the task of devising a method of the type discussed here that minimizes the computational complexity of detecting a useful signal from a measurement signal that is overlaid by at least one interference signal, so that the useful signal can be detected in real time by the control or regulating device, for example in a motor vehicle.

This objective is accomplished using a method for detecting a useful signal from a measurement signal that is overlaid by at least one interference signal that can be used in a control or regulating device, for example in a motor vehicle or similar, in which the interference signal occurs with at least one known interference signal frequency, and whereby the method is characterized by: detection of the measurement signal during a first step, performance of a Fourier transformation of the measurement signal in order to detect the interference signal amplitude and the interference signal phase during a second step, detection of the interference signal on the basis of the interference signal amplitude and the interference signal phase during a third step, as well as a removal of the interference from the measurement signal in order to detect the useful signal during a fourth step.

The essence of the invention consists of the Fourier transformation performed during the second step not being performed with reference to a plurality of frequencies, as in the state of the art, but rather only with reference to the known interference signal frequency. That results in a major reduction in the computational complexity of detecting the useful signal from the measurement signal, so that the useful signal can be detected in real time by the control or regulating device of a motor vehicle.

Numerous measurement signals that occur in the components of a motor vehicle can come into question as measurement signals within the meaning of the invention, whereby certain combinations of measurement signal and interference signal are particularly typical of motor vehicles.

In a first constructional variant of the method of the invention, detection of the measuring signal is done during a first step on the basis of the actuating position of a clutch of the motor vehicle when the cause of the interference signal is a wobbling of the drive shaft of the motor vehicle drive motor. Wobbling occurs when unbalances occur on the shaft of the drive motor. These unbalances can be inherent and/or caused by wear due to operation. The longer a motor vehicle is in operation, the more wear and thus unbalance increase, which leads to greater wobbling and the corresponding interference signals. The method of the invention is therefore particularly advantageous for motor vehicles that have been in use for an extended period.

In a second constructional variant of the method of the invention, the detection of the measurement signal is done during the first step on the basis of the actuating position of a clutch of the motor vehicle whereby the cause of the interference signal is a judder vibration in the clutch. Judder vibration in clutches occurs due to contamination of or warped components in the clutch. Contamination and warping are caused by wear, which is why, as in the case of the first construction variant, the method of the invention can be used to particular advantage in motor vehicles that have been in use for an extended period of time.

Interference signals are often caused by internal oscillation in certain components of a motor vehicle. As the frequencies of internal oscillation can usually be determined and therefore represent known interference signals in the sense of the invention, the method of the invention is directly applicable here as well.

The drive train of a motor vehicle, in its entirety, is known to consist of components that are susceptible to oscillation. Therefore, in a third construction variant of the method of the invention, the measurement signal is detected during the first step on the basis of the initial rotational speed of the transmission of the motor vehicle, where the cause of the interference signal is a natural oscillation of the drive train. In a fourth construction variant, the measurement signal is detected during a first step on the basis of the rotational speed of the drive wheels of the motor vehicle, whereby the cause of the interference signal is a natural oscillation of the drive train. In the case of the latter two construction variants, the basis on which the measurement signal is detected depends on the technical conditions in each case. Here it must be kept in mind that wheel speed is known to be considerably lower than the initial rotational speed of the transmission and therefore produces poorer temporal resolution. To this extent, the rotational speed signal of the transmission output shaft, if available, should therefore be preferred to an existing wheel rotational speed signal.

There are several possibilities for the removal of the interference signal from the measurement signal that takes place during the fourth step. According to a fifth construction variant of the method of the invention, this removal consists of a subtraction of the interference signal from the measurement signal. This option is particularly simple in computational terms and is always applicable when the useful signal and the interference signal combine in making up the measurement signal.

In an additional construction variant, the useful signal is an oscillating signal, for example, an oscillating signal in a drive train of a motor vehicle. The measurement signal is thus comprised of an oscillation signal and an interference signal with a known interference frequency, which is superimposed on this oscillation signal. After removal of the interference signal from the measurement signal, the useful signal present here as an oscillation signal can be used in the corresponding control and/or regulating algorithms.

BRIEF DESCRIPTION OF THE DRAWING

The method of the invention is explained in general terms below with reference to the accompanying drawings which show.

DETAILED DESCRIPTION OF THE PREFERRED EMBODIMENT

Figure 1:
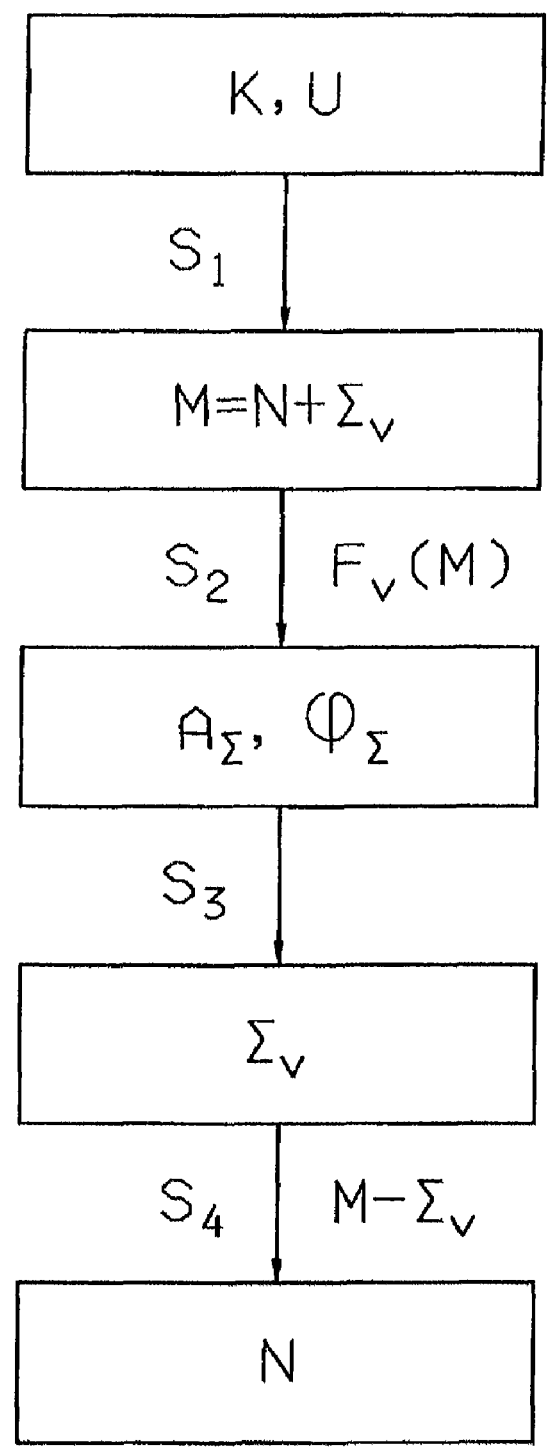
FIG. 1 a schematic flow diagram to explain the method of the invention.
Figure 2:
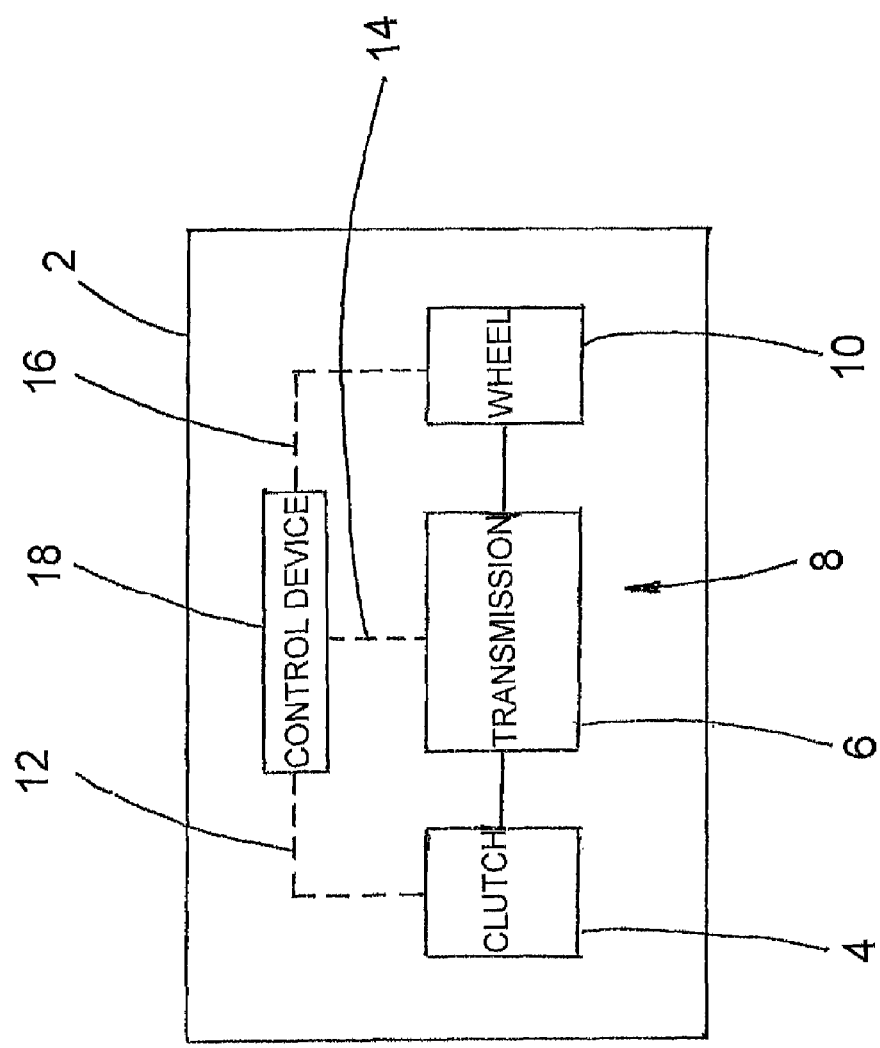
FIG. 2 a schematic diagram of a motor vehicle illustrating components of a drive train.

As shown in FIGS. 1 and 2, the starting point of the method of the invention is a parameter K specific to the operation of a motor vehicle component and a cause U of an interference with a known cycle. In motor vehicles 2, certain combinations of the parameter K and the cause U are especially typical. Examples of combinations of this type are the actuating position of the starting clutch 4 of the motor vehicle as parameter K and a wobbling of the drive shaft of the motor vehicle drive motor as cause U of the interference, the actuating position of the starting clutch of the moor vehicle as parameter K and a judder vibration of the clutch as cause U of the interference, the mean initial rotational speech of the transmission 6 of the motor vehicle as parameter K and a natural oscillation of the drive train 8 as cause U of the interference, or the rotational speed of the wheels 10 of the motor vehicle as parameter K and a natural vibration of the drive train as cause U. Other combinations commonly used by a specialist in the area of motor vehicle technology are also possible.

In a first step $S_1$, through the use of suitable sensors, an electrical measurement signal M is detected from the parameter K and the cause U of the periodic interference. The measurement signal M represents the overlay of two signals, i.e. a useful signal N and an interference signal $\Sigma_v$. Here the useful signal N is derived from the parameter K, while the interference signal $\Sigma_v$ occurs as the result of an interference. Because the interference is periodic, the interference signal $\Sigma_v$ occurs with an interference signal frequency v. The superimposition of the useful signal N and the interference signal $\Sigma_v$ that produces the measurement signal M is seen in the simplest case as the sum of the useful signal N and the interference signal $\Sigma_v$.

The detection of the measurement signal is done using a method and devices known to a specialist in the area of motor vehicle technology, for example by using sensors 12, 14, 16 to detect the rotational speeds, actuating positions of a clutch, speed of the vehicle, or other parameters, and then presenting them in a usable form, for example in the form of an electric voltage to a control or regulating device 18.

In a second step $S_2$, a Fourier transformation $F_v(M)$ is done on the measurement signal M with reference to the known interference signal frequency v. By means of the Fourier transformation $F_v(M)$, the interference signal amplitude $A_\Sigma$ and the interference signal phase $\phi_\Sigma$ of the interference signal $\Sigma_v$ are detected. The Fourier transformation $F_v(M)$ is done in a control or regulating device of the motor vehicle, usually in the form of a computer program.

In a third step $S_3$, the interference signal $\Sigma_v$ is detected on the basis of the interference signal amplitude $A_\Sigma$ and the interference signal phase $\phi_\Sigma$. The detection of the interference signal $\Sigma_v$ on the basis of the interference signal amplitude $A_\Sigma$ and the interference signal phase $\phi_\Sigma$ is also done in the control or regulating device of the motor vehicle.

Both the Fourier transformation $F_v(M)$ done in the second step $S_2$ and the detection of the interference signal $\Sigma_v$ done in the third step $S_3$ are known to the specialist in the area of motor vehicle technology and will therefore not be described in more detail here.

Finally, in a fourth step $S_4$ the interference signal $\Sigma_v$ is removed from the measurement signal M, in order to detect the useful signal N. Because the measurement signal M consists of a sum of the useful signal N and the interference signal $\Sigma_v$, the removal of the interference signal $\Sigma_v$ from the measurement signal M, in the present case, consists of a subtraction of the interference signal $\Sigma_v$ from the measurement signal M. The subtraction in the fourth step $S_4$ is also done in the control or regulating device of the motor vehicle.

The useful signal N detected by means of the method of the invention can also be used for analysis of the parameter K underlying the signal N, and then used for its control or regulation.

The above description assumes that the measurement signal M is overlaid by an interference signal $\Sigma_v$ with a known interference signal frequency v. It is obvious that the measurement signal M can also be overlaid by a plurality of interference signals $\Sigma_v$, each of which can occur with its own interference signal frequency. In that case, the second step $S_2$, the third step $S_3$, and the fourth step $S_4$ of the method of the invention are performed separately for each interference signal frequency v.

The use of the method of the invention is not limited to motor vehicle technology. The method of the invention can actually be applied to all areas of technology where one measurement signal M is overlaid by at least one interference signal $\Sigma_v$.

It was made clear that the Fourier transformation $F_v(M)$ in the second step $S_2$ of the inventive procedure is done only with reference to the known interference signal frequency v of the $\Sigma_v$. In this way, the computational complexity of detecting the useful signal N from the measurement signal M is kept to a minimum, which is why the useful signal can be detected in real time by the control or regulating device of the motor vehicle.

REFERENCE SIGNS

K Parameter
M Measurement signal
N Useful signal
U Cause of interference
$\Sigma_v$ Interference signal
v Interference signal frequency
$F_v(M)$ Fourier transformation of the measurement signal
$A_\Sigma$ Interference signal amplitude
$\phi_\Sigma$ Interference signal phase
$S_1$ First step
$S_2$ Second step
$S_3$ Third step
$S_4$ Fourth step

The invention claimed is:

1. A method of detecting a useful signal (N) from a measurement signal (M) that is overlaid by at least one interference signal ($\Sigma_v$), which occurs with at least one known interference signal frequency (v), and the useful signal (N) being utilized in a control or regulating device, the method comprising the steps of:
   detecting the measurement signal (M);
   performing a Fourier transformation ($F_v(M)$) of the measurement signal (M) only with reference to the known interference signal frequency (v) to detect an interference signal amplitude ($A_\Sigma$) and an interference signal phase ($\phi_\Sigma$);
   detecting the interference signal ($\Sigma_v$) on a basis of the interference signal amplitude ($A_\Sigma$) and the interference signal phase ($\phi_\Sigma$); and
   subtracting the interference signal ($\Sigma_v$) from the measurement signal (M) to detect the useful signal (N).

2. The method according to claim 1, further comprising the step of basing the detection of the measurement signal (M) on an actuating position of a clutch of a motor vehicle with wobbling of a shaft of the motor vehicle drive motor (U) which causes the interference signal ($\Sigma_v$).

3. The method according to claim 1, further comprising the step of basing the detection of the measurement signal (M) on an actuating position of a clutch of a motor vehicle with judder vibration in the clutch (U) which causes the interference signal ($\Sigma_v$).

4. The method according to claim 1, further comprising the step of basing the detection of the measurement signal (M) on an initial rotational speed of a transmission of a motor vehicle with internal oscillation of a drive shaft (U) which causes the interference signal ($\Sigma_v$).

5. The method according to claim 1, further comprising the step of basing the detection of the measurement signal (M) on a rotational speed of wheels of a motor vehicle with a natural oscillation of a drive train (U) which causes the interference signal ($\Sigma_v$).

6. A method of detecting a useful signal (N) from a measurement signal (M) that is overlaid by a plurality of interference signals ($\Sigma_v$) such that useful signal (N) is utilized in real time by one of a control device or a regulating device in a motor vehicle, where the plurality of interference signals ($\Sigma_v$) occur with known interference signal frequencies (v), the method comprising the step of:
   sensing at least one of an initial transmission rotational speed, a wheel rotational speed, and a clutch actuating position in a drive train of a motor vehicle;
   transmitting the at least one initial transmission rotational speed, the wheel rotational speed, and the clutch actuating position to the control device or the regulating device in the form of an electrical voltage as the measurement signal (M);
   determining, with the control device or the regulating device, an amplitude ($A_\Sigma$) and a phase ($\phi_\Sigma$) of the interference signal ($\Sigma_v$) by performing of a Fourier transformation ($F_v(M)$) on the measurement signal (M) only with reference to the known interference signal frequency (v);
   determining, with the control device or the regulating device, the interference signal ($\Sigma_v$) based on the amplitude ($A_\Sigma$) and the phase ($\phi_\Sigma$) of the interference signal ($\Sigma_v$);
   calculating, with the control device or the regulating device, the useful signal (N) by subtracting the interference signal ($\Sigma_v$) from the measurement signal (M);
   performing the steps of determining the amplitude ($A_\Sigma$) and the phase ($\phi_\Sigma$) of the interference signal ($\Sigma_v$), determining the interference signal ($\Sigma_v$) and calculating the useful signal (N) for each of the plurality of interference signals ($\Sigma_v$) separately, and
   controlling or regulating at least one component of the drive train in real time based on the calculated useful signals (n).

* * * * *